United States Patent [19]

Pikkarainen

[11] Patent Number: 5,289,059
[45] Date of Patent: Feb. 22, 1994

[54] SWITCHED CAPACITOR DECIMATOR

[75] Inventor: Juha Pikkarainen, Oulu, Finland

[73] Assignee: Nokia Mobile Phones, Ltd., Helsinki, Finland

[21] Appl. No.: 893,752

[22] Filed: Jun. 5, 1992

[51] Int. Cl.[5] .............................................. H03B 5/00
[52] U.S. Cl. .................................... 307/520; 307/271; 328/15; 328/167
[58] Field of Search ..................... 307/271, 520, 521; 328/15, 16, 167; 331/53

[56] References Cited

U.S. PATENT DOCUMENTS

| | | | |
|---|---|---|---|
| 4,331,894 | 5/1982 | Gregorian et al. | 307/520 |
| 4,754,226 | 6/1988 | Lusignan et al. | 328/167 |
| 4,841,263 | 6/1989 | Mulawka et al. | 307/520 |
| 4,894,620 | 1/1990 | Nagaraj | 307/521 |

OTHER PUBLICATIONS

"Integrated Switched-Capacitor Low-Pass Filter with Combined Anti-Aliasing Decimation Filter for Low Frequencies", IEEE J. Solid-State Circuits, vol. 17, pp. 1024–1028, Dec. 1982, D. von Grunigen et al.
"Improved Offset-Compensation Schemes for Switched-Capacitor Circuits", K. Haug et al., ISCAS 1984, pp. 1054–1057.
"Spike-Free Switched-Capacitor Circuits" by Matsumoto et al., Electronics Letters 9th, vol. 23, No. 8, (Apr. 1987).
Robert Gregorian et al., "Switched-Capacitor Circuit Design", Proceedings of IEEE, vol. 71, No. 8, Aug. 1983, pp. 941–966.

Primary Examiner—William L. Sikes
Assistant Examiner—Shawn Riley
Attorney, Agent, or Firm—Perman & Green

[57] ABSTRACT

A switched capacitor decimator circuit (20) is shown to be useful in a cellular telephone that operates in accordance with a subaudible signalling protocol. The switched capacitor decimator circuit has an input node for inputting a received signal that includes a subaudible signalling component and an interfering voice component. The switched capacitor decimator circuit further has an output node for outputting a signal having an amplified subaudible signalling component and voice component. The circuit includes an operational amplifier (22) having an input and an output and a characteristic DC offset voltage. A first capacitance (Cint) is switchably coupled, at a rate equal to a first frequency, between the input and the output of the operational amplifier. A second capacitance (Cin) is coupled between the input node and the input of the operational amplifier. A gain (G) of the circuit is given by Ncin/Cint, where n is a ratio of the first frequency to a second, lower frequency. The circuit further includes circuitry (C3, C4) for DC offset compensating the switched capacitor decimator circuit such that the DC offset voltage of the operational amplifier appears at the output node amplified only with a gain of unity.

5 Claims, 4 Drawing Sheets a24 0 ASSERTED b240 ASSERTED

SWITCHED CAPACITOR DECIMATOR

FIELD OF THE INVENTION

This invention relates generally to switched capacitor (SC) circuits and, in particular, to a switched capacitor decimation circuit (SC decimator).

BACKGROUND OF THE INVENTION

As described in an article entitled "Integrated Switched-Capacitor Low-Pass Filter with Combined Anti-Aliasing Decimation Filter for Low Frequencies", IEEE J. Solid-State Circuits, vol. SC-17, PP. 1024–1028 (12/82), by D. C. von Grunigen et al., a SC filter operates as a sampled-data network. As a result, the input signal must be band limited to prevent aliasing. A technique presented by von Grunigen et al. uses a SC prefilter (referred to as a decimation filter) that provides zeros at integer multiples of a clock frequency $f_c$. This is accomplished by sampling the SC prefilter at a higher clock rate $nf_c$. FIG. 3 of this article shows such an SC prefilter.

One of a number of uses for a SC filter is in a baseband signalling circuit of a cellular telephone.

One problem that arises in the use of a cellular telephone is when it is desired to employ two different signalling protocols, such as a wide bandwidth signalling protocol and a narrow bandwidth signalling protocol.

For example, one wide bandwidth voice channel protocol is known as Advanced Mobile Phone Service (AMPS). AMPS is used in parts of North and South America. Another wide bandwidth voice channel protocol is known as Total Access Communication System (TACS), which is used in, by example, the United Kingdom, Italy, and Spain. Two Narrow bandwidth voice channel protocols are known as NAMPS and NTACS, both of which employ subaudible signalling.

Difficulties arise in that the NAMPS/NTACS signalling protocols are quite different from that of the AMPS/TACS signalling protocols. The most significant differences include the following.

In AMPS/TACS the signalling is a "blank-and-burst" type; i.e., the voice signal is muted during signalling. However, in the NAMPS/NTACS system the signalling is accomplished by continuous subaudible signalling below the voice band. As a result, in NAMPS/NTACS the voice signal acts as an interference signal for the subaudible signalling.

The effective bit rate for the signalling circuit is 10 Kbit/s and 8 Kbit/s for AMPS and TACS, respectively, but only 100 bit/s for NAMPS/NTACS.

The deviation for signalling is ±8 Khz/±6.4 Khz in AMPS/TACS, and ±700 Hz in NAMPS/NTACS. If it is desired to maintain the same demodulation sensitivity of the RF receiver for both protocols, a problem arises in that the input signal level of the signalling circuit will be reduced by the same ratio in NAMPS/NTACS, as compared to AMPS/TACS.

Furthermore, when employing the NAMPS/NTACS protocols the interfering voice signal must be attenuated during signalling data reception.

One method of solving this problem is to employ the SC technique described by von Grunigen et al. to convert the effective input sampling frequency to a higher frequency in order to ease the anti-aliasing filtering requirements.

A main function of an analog front end of the signalling circuit, in addition to filtering noise and interference, is to detect the zero crossings of the incoming data signal by converting the signal to a square wave signal to be used in subsequent digital data processing circuitry. In this process, the difference between the DC level of the signal at the input to comparator and a DC comparison level becomes critical. Thus, any additional DC voltage added to the signal distorts the detection of the zero crossings of the input data signal, resulting in an increase in the Bit Error Rate (BER) of the detected subaudible signalling data.

One major source of this DC level shift is the offset voltages of the operational amplifiers (opamps) in the signal filters. In that a significant amount of amplification is required, due to the low input signal levels (nominally 35 mVpp for NAMPS); with conventional circuit structures the offset voltages of the opamps are also amplified. As a result, the DC offset of the signal is increased, leading to the above described difficulties in extracting the signalling data.

A straightforward solution to this problem is to provide a DC blocking capacitor and a DC biasing resistor at the input of the data comparator. However, the corner frequency of the DC blocking components must be very low (less than 2 Hz) when operating with the NAMPS/NTACS protocols, due to the low signalling frequency. This would require a large RC constant, which is extremely difficult or impossible to provide within a typical integrated circuit structure. One solution would be to implement the DC blocking function with external components. However, this approach would require additional interface pins for the integrated circuit. Furthermore, the use of external components would increase both the total cost and the area required for a printed circuit board.

In an article entitled "Improved Offset-Compensation Schemes For Switched-Capacitor Circuits", (ISCAS '84), pages 1054–1057, by K. Haug et al., techniques are described for compensating offset voltages of the opamps in SC circuits. FIG. 2 of this article shows an offset-free non-inverting SC integrator wherein an input-referred DC offset voltage of an operational amplifier is cancelled during the period (phi 1=1). This phase should thus be used for sampling by a subsequent stage. Eq. 5 describes a change in the output voltage during the period (phi 2=1), compared to the period (phi 1=1), and shows that the change is small, and that the opamp slew requirements are relaxed (FIG. 5). Although the opamp offset is totally compensated, this article describes an integrator, and not a decimator.

An article entitled "Spike-Free Switched-Capacitor Circuits", Electronics Letters 9th, Vol. 23 No. 8, (4/87), pages 428–429, by H. Matsumoto et al., describes an improvement to these structures, and shows the use of capacitance multiplier (CM) feedback.

OBJECTS OF THE INVENTION

What is not shown in the foregoing articles, and what is thus an object of this invention to provide, is an offset compensated SC decimator.

A further object of this invention is to provide a SC decimator that amplifies the offset voltage of an internal opamp only with a gain of unity.

A still further object of this invention is to provide a SC decimator that is suitable for use as a component of a filter in a baseband signalling circuit of a cellular telephone, and that does not adversely impact the BER of detected signalling data.

SUMMARY OF THE INVENTION

Disclosed is a switched capacitor decimator circuit that is shown to be especially useful in a cellular telephone that operates in accordance with a subaudible signalling protocol. The switched capacitor decimator circuit has an input node for inputting a received signal that includes a subaudible signalling component and an interfering voice component. The switched capacitor decimator circuit further has an output node for outputting a signal having an amplified subaudible signalling component and also the interfering voice component.

The circuit includes an operational amplifier having an input and an output and a characteristic DC offset voltage. The output of the operational amplifier is coupled to the output node.

A first capacitance (Cint) is switchably coupled, at a rate equal to a first frequency, between the input and the output of the operational amplifier. A second capacitance (Cin) is coupled between the input node and the input of the operational amplifier.

A gain (G) of the switched capacitor decimator circuit is shown to be given by nCin/Cint, where n is a ratio of the first frequency to a second, lower frequency.

In accordance with the invention, the circuit further includes circuitry for DC offset compensating the switched capacitor decimator circuit such that the DC offset voltage of the amplifier means appears at the output node amplified only with a gain of unity.

Cint is comprised of a first capacitance (Cint1) and a second capacitance (Cint2) that is switchably coupled in parallel with Cint1, whereby the gain of the switched capacitor decimator circuit is controllably set to one of at least two values in accordance with a type of subaudible signalling protocol that is employed.

In a presently preferred embodiment of the invention the subaudible signalling protocol is selected from NAMPS and NTACS.

The second frequency is a frequency selected as the clock frequency for a switched capacitor filter that is coupled to the output node for filtering out the interfering voice signal component from the subaudible signalling component. In the presently preferred embodiment, the first frequency is approximately 240 kHz and the second frequency is approximately 8 kHz.

A capacitance is coupled between the output of the operational amplifier and the input node for suppressing a switching transient of the switched capacitor decimator circuit.

DETAILED DESCRIPTION OF THE INVENTION

Figure 1:
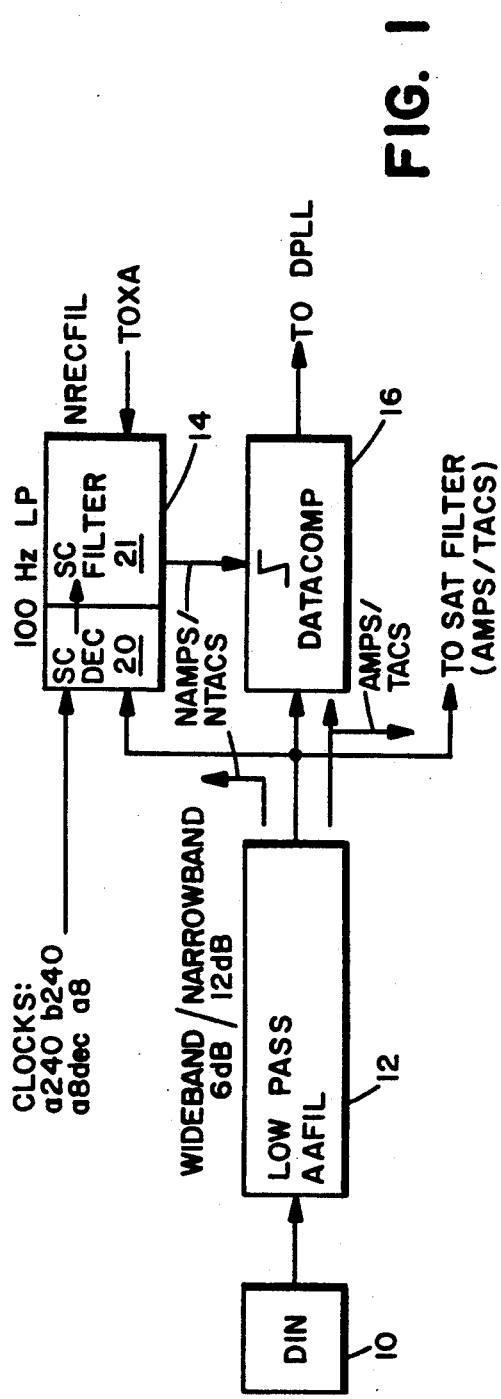
FIG. 1 is block diagram of a portion of a signalling circuit for use in a cellular telephone.

As was described above, when using the NAMPS/NTACS subaudible signalling protocols the interfering voice signal must be attenuated during signalling data reception. Referring to FIG. 1, which illustrates a portion of a dual-mode baseband signalling circuit for a cellular telephone, a received and demodulated RF signal is input to node DIN 10, which provides the input signal to a low pass filter AAFIL 12. In the AMPS/TACS mode, AAFIL 12 is a 6dB filter, while in NAMPS/TACS mode AAFIL 12 operates as a 12 dB filter. An output of AAFIL 12 is applied to a filter NRECFIL 14, which attenuates the interfering voice signal in the NAMPS/NTACS mode of operation. NRECFIL 14 operates as a $4^{th}$ order 100 Hz corner frequency Bessel type filter, and includes the switched capacitor decimator 20 of the invention.

It is noted that the switched capacitor decimator 20 does not perform a filtering function. Instead, and as was previously described, the switched capacitor decimator converts the effective input sampling frequency to a higher frequency in order to ease the anti-aliasing filtering requirements. In this case, and as will be described in detail below, the effective input sampling frequency is changed from 8 kHz to 240 kHz by the switched capacitor decimator 20.

In the presently preferred embodiment of the invention, 8 kHz is selected as the clock frequency for the SC filter 21 of NRECFIL 14.

In this regard, it is noted that if the ratio between the clock frequency and the corner frequency of a SC filter is large, the required capacitor ratios also become large. This increases chip area requirements and deteriorates the filter sensitivity. On the other hand, if the absolute value of the clock frequency is low, the filtering requirements of the anti-aliasing filter become difficult to achieve within a reasonable chip area. A frequency of 8 kHz approaches the limits of what a typical active RC anti-aliasing filter can accommodate and, as a result, the switched capacitor decimator 20 is employed.

The output of AAFIL 12 is also applied to Supervisory Audio Tone (SAT) processing circuitry, and filter (SAT FILTER) which is employed in the AMPS/TACS modes of operation. A baseband signalling circuit that operates with the AMPS/TACS signalling protocols and with the NAMPS/NTACS signalling protocols is described in commonly assigned U.S. patent application Ser. No. 07/893,769, filed on even date herewith, and entitled "Cellular Telephone Signalling Circuit Operable with Different Cellular Telephone Systems", by R. Kivari and J. Pikkarainen.

The function of the continuous time active RC filter AAFIL 12 is to attenuate the spectrum contents around the 8 kHz clock frequency, and its multiples, to prevent aliasing in sampling.

As was noted above, if the clock frequency is low, the corner frequency of the anti-aliasing filter must also be made low. This results in the requirement of a large RC constant. However, in CMOS technology resistors consume a significant chip area, and the resulting anti-aliasing filter, with attenuation around 8 kHz, would require a large chip area.

The AAFIL 12 has a stopband beginning at 192 Khz (AMPS/TACS SATFIL clock frequency). If the SC decimator of the invention were not employed, a separate anti-aliasing filter would be required for NAMPS/NTACS reception, the second anti-alasing filter having a stopband beginning at 8 kHz (NRECFIL clock frequency). However, the second anti-aliasing filter would require a significant amount of chip area. The teaching of the invention solves this problem by providing the SC decimator with a decimation factor (n) of 30, thereby allowing the wideband anti-aliasing filter to also be used for narrowband reception.

A most effective method of solving this problem is to employ an SC circuit that is improved over that described by von Grunigen et al. With a decimation ratio of 30, an effective input sampling rate of 240 kHz is achieved. As a result, the AAFIL 12 can be employed without modifications. The SC decimator 20 circuit is included within the block NRECFIL 14, and is described in detail below.

In FIG. 1, the block DATACOMP 16 performs the detection and conversion to digital signalling data. In this process the difference between the DC level of the signal at the input to DATACOMP 16 and a DC comparison level of DATACOMP 16 becomes critical. Any additional DC voltage added to the signal in the path between DIN 10 and the input of DATACOMP 16 distorts the detection of the actual zero crossings of the input data signal.

AAFIL 12 amplifies the offset voltage of an internal opamp with a gain of one, and thus does not contribute a large DC offset to its output signal.

Figure 3:
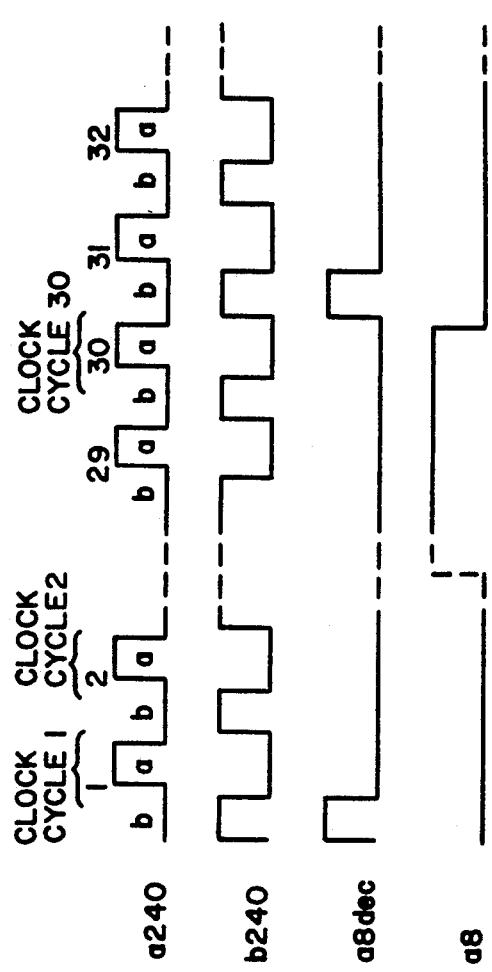
FIG. 3 is a timing diagram that illustrates the relationship between clock pulses that are applied to the SC decimator of FIG. 2.
Figure 2:
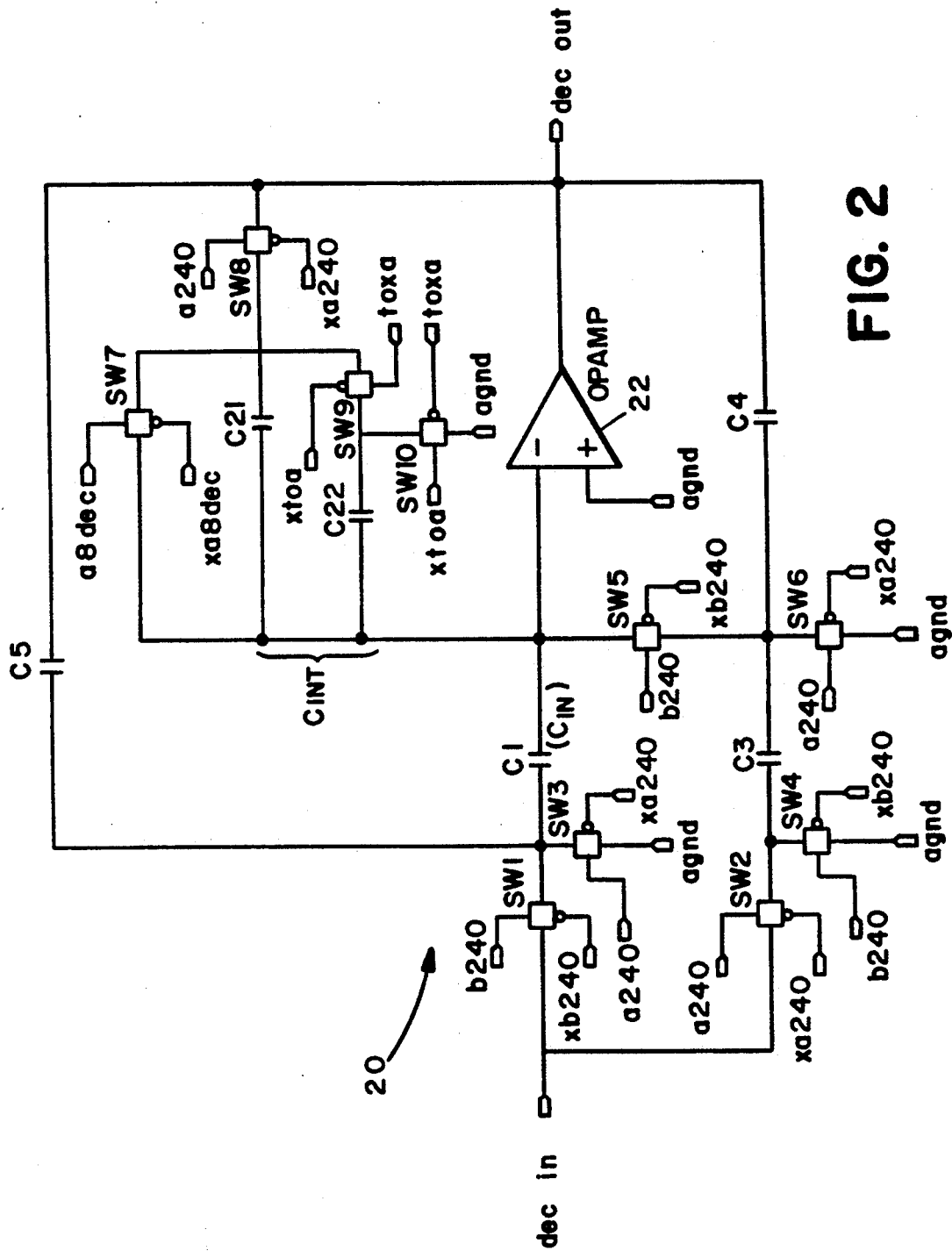
FIG. 2 is a schematic diagram of a presently preferred embodiment of a SC decimator.

FIG. 2 is a schematic diagram of the SC decimator 20 of the invention, and FIG. 3 is a timing diagram illustrating the relationship between the various clock signals that drive the SC decimator 20. By example, a240 is a 240 kHz signal and, as a result, the decimation ratio (n) of the circuit 20 is 30 (240 kHz/8 kHz) Signal a8 of FIG. 3 shows the eight kHz signal that clocks the SC filter 21 that receives its input from the output (decout) of the SC decimator 20. The SC filter 21 is not shown in FIG. 2. It is noted that, for proper operation, the output of the SC decimator 20 should be sampled by SC filter 21 (a8 goes low) just before the integration capacitor (Cint) is discharged (a8dec goes high).

Devices SW1-SW10 are analog switches that contain both an NMOS and a PMOS transistor. Therefore, each switch requires also an inversion of the clock signal; xa240 is the inversion of a240, xb240 is the inversion of b240, etc. As can be seen in FIG. 3, clocks a240 and b240 are non-overlapping, and are not simultaneously high (asserted). Other types of switches may be employed that do not require the use of an inverted control signal.

The SC decimator 20 includes a gain selection control (toxa) for specifying whether NAMPS or NTACS protocols are being received. As a result, signal clipping is avoided for a maximum specified signal excursion when using the NTACS protocol.

In accordance with the invention, the SC decimator 20 does not amplify the DC offset of the opamp 22. The opamp 22 offset voltage appears at the output (decout) only with a gain of 1 (unity).

The gain of the SC decimator 20 is determined by integration capacitors C21 and C22, and by the input capacitance C1. Signal a8dec, in conjunction with SW7, is employed to reset Cint (capacitors C21 and C22) as shown in FIG. 3. Capacitors C3 and C4 provide for the offset compensation. C5 functions as a "spike-free" capacitor, as described in the beforementioned article by H. Matsumoto et al. Control signal toxa/xtoa determines the gain by connecting capacitor C22 in parallel with C21 (SW9 closed, SW 10 open), or disconnecting C22 (SW9 open, SW10 closed), as described below.

To illustrate the operation and utility of the SC decimator 20 of the invention, time difference equations of the decimator shown in the FIG. 3 of the article by von Grunigen et al., and of the SC decimator 20 of the present invention, are compared below.

---

Decimator of von Grunigen et al.
  $\phi$ is equivalent to a240
  $\phi$ is equivalent to b240
  $\phi'$ is equivalent to a8dec
  $\phi^e$ is equivalent to a8
  Voff = offset voltage of the opamp
voutxy = output voltage at phase y of clock cycle x
vinxy = input voltage at phase y of clock cycle x
1b (phase b of clock cycle 1):
  vout1b = Voff (Co discharged, opamp as voltage follower).
1a:
  From the charge conservation at the negative input of the opamp =>
  $C_i(-V_{off} - vin1b) + C_o(vout1a - V_{off}) = 0$
  => vout1a = $(C_i/C_o)(vin1b + V_{off}) + V_{off}$
2b:
  vout2b = vout1a
2a:
  $C_i(-V_{off} - vin2b) + C_o(vout2a - V_{off} - vout2b + V_{off}) = 0$
  => vout2a = vout2b + $(C_i/C_o)(vin2b + V_{off})$
        = vout1a + $(C_i/C_o)(vin2b + V_{off})$
        = $(C_i/C_o)(vin1b + vin2b) + 2(C_i/C_o)V_{off} + V_{off}$

.
.

30a: (phase a of clock cycle 30)
  vout30a = $(C_i/C_o)(vin1b + vin2b + \ldots + vin30b) + 30(C_i/C_o)V_{off} + V_{off}$

---

At phase 30a the output voltage is sampled to the input of the next stage by clock signal $\phi^e$. As can be seen above, the offset voltage (Voff) is amplified by a factor $n(C_i/C_o) = 30(C_i/C_o)$, which is the DC gain of the decimator. This amplification of the DC offset voltage is undesirable for the reasons described above.

Figure 4:
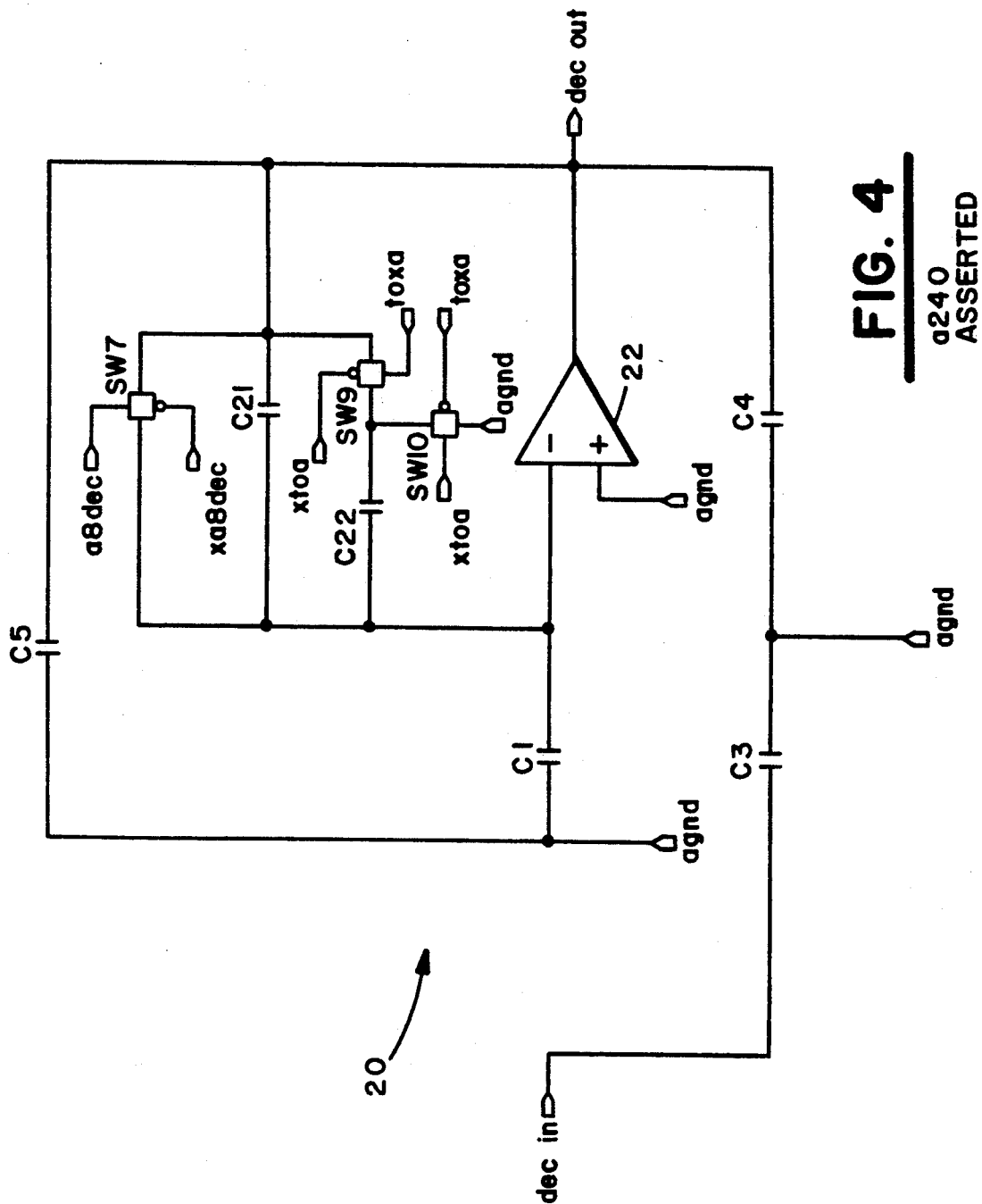
FIG. 4 is a schematic diagram that illustrates the effect on the circuit of FIG. 2 when the a240 clock of FIG. 3 is asserted.
Figure 5:
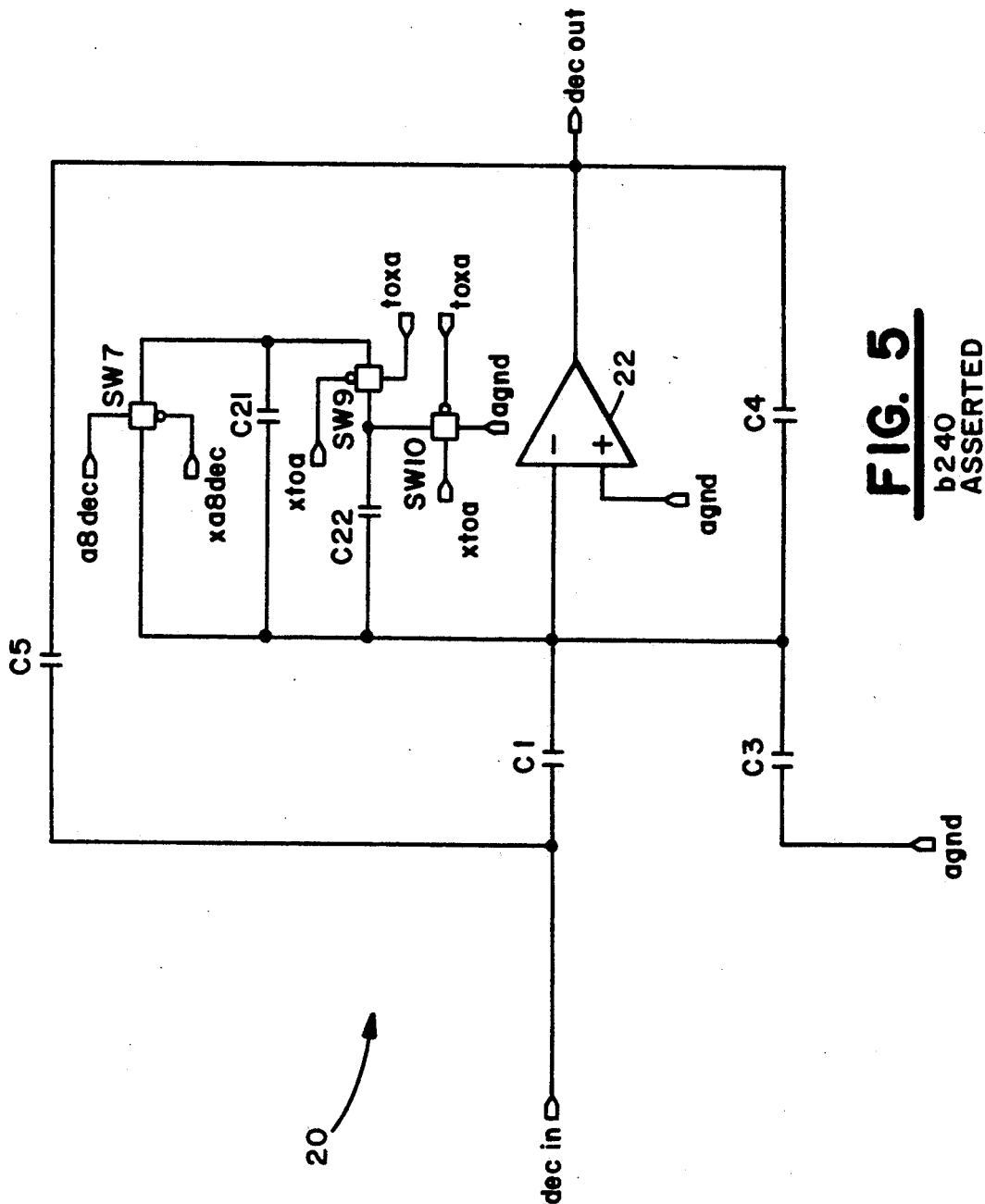
FIG. 5 is a schematic diagram that illustrates the effect on the circuit of FIG. 2 when the b240 clock of FIG. 3 is asserted.

SC decimator 20:

A description of the operation of the SC decimator 20 is now provided. As an aid in understanding the operation of SC decimator 20, FIG. 4 shows the effective circuit configuration during the time that a240 is asserted, and FIG. 5 shows the effective circuit configuration during the time that b240 is asserted.

The integration capacitor (c21 or (c22+c22), depending on the state of toxa) is noted as c2 below.

---

1b: (phase b of clock cycle 1)
  $c1(vin1b - V_{off} + V_{off}) + c3(-V_{off} - vin0a) + c4(vout1b - V_{off} - vout0a) = 0$
  => vout1b = vout0a + $(c3/c4)vin0a - (c1/c4)vin1b + (c3/c4)V_{off} + V_{off}$
1a:
  $c1(-V_{off} - vin1b + V_{off}) + c2(vout1a - V_{off}) = 0$
  => vout1a = $(c1/c2)vin1b + V_{off}$
2b:
  $c1(vin2b - V_{off} + V_{off}) + c3(-V_{off} - vin1a) + c4(vout2b - V_{off} - vout1a) = 0$
  =>0 vout2b = vout1a + $(c3/c4)Vin1a - (c1/c4)vin2b + (c3/c4)V_{off} + V_{off}$
2a:

```
    c1(−Voff − vin2b + Voff) +
    c2(vout2a − Voff − vout1a + Voff) = 0
    => vout2a = vout1a + (c1/c2)vin2b
              = (c1/c2)(vin1b + vin2b) + Voff
30a: (phase a of clock 30)
    vout30a = (c1/c2) (vin1b + vin2b + ... +
        vin30b) + Voff
```

As can be seen, the offset voltage of the opamp 22 is not amplified by the DC gain of the SC decimator 20, as was the case for the conventional circuit described above.

In switched capacitor applications the capacitors are normally constructed from so-called unit capacitors. The absolute capacitance of the unit capacitor is a function of the technology and the required accuracy. A representative value is 0.5 pF. Representative values for capacitors c1–c5, expressed in numbers of unit capacitors, is as follows:

c1 = 1.0
c21 = 15.0
c22 = 3.0
c3 = 1.0
c4 = 1.0
c5 = 1.0.

The DC gain is determined by c1, c21 and c22, and is either:

nc1/c21 = 30c1/c21 (toxa = 0), or
nc1/(c21 + c22) = 30c1/(c21 + c22) (toxa = 1).

In the presently preferred embodiment the DC gain (G) is:

G = (30 × 1.0) /15.0 = 2.0 = 6.0 dB (toxa = 0),
or
G = (30 × 1.0)/(15.0 + 3.0) = 1.67 = 4.44 dB (toxa = 1).

The values of c3, c4 and c5 do not affect the transfer function, and may selected be as desired.

Although described in the context of a SC decimator used in a baseband signalling circuit of a cellular telephone that employs a narrow bandwidth voice channel with a subaudible signalling protocol, the practice of the invention is not intended to be limited to only this one important application. That is, the SC decimator 20 may be employed to advantage in a number of applications other than cellular telephones.

It should thus be understood that the foregoing description is only illustrative of the invention. Various alternatives and modifications can be devised by those skilled in the art without departing from the invention. Accordingly, the present invention is intended to embrace all such alternatives, modifications and variances which fall within the scope of the appended claims.

What is claimed is:

1. A switched capacitor decimator circuit having an input node and an output node, comprising:
   amplifier means having an input and an output, said output of said amplifier means being coupled to said output node, said amplifier means having a characteristic DC offset voltage;
   a first capacitance (Cint) that is switchably coupled, at a rate equal to a first frequency, between said input and said output of said amplifier means;
   a second capacitance (Cin) that is coupled between said input node and said input of said amplifier means, wherein a gain G of said switched capacitor decimator circuit is given by nCin/cint, where n is a ratio of said first frequency to a second, lower frequency; and
   means for DC offset compensating said switched capacitor decimator circuit such that the DC offset voltage of said amplifier means appears at said output node amplified with a gain of unity.

2. A switched capacitor decimator circuit as set forth in claim 1 wherein Cint is comprised of a first capacitance (Cint1) and a second capacitance (Cint2) that is switchably coupled in parallel with Cint1, and wherein a gain of said switched capacitor decimator circuit is controllably set to one of at least two valves by selectively switching Cint2 in parallel with Cint1.

3. A switched capacitor decimator circuit as set forth in claim 1 and further including a capacitance coupled between said output of said amplifier means and said input node for suppressing a switching transient of said switched capacitor decimator circuit.

4. A switched capacitor decimator circuit having an input node and an output node, comprising:
   amplifier means having an input and an output, said output of said amplifier means being coupled to said output node, said amplifier means having a DC offset voltage;
   a first capacitance having a first terminal that is switchably coupled between said input node and a reference potential, said first capacitance having a second terminal that is coupled to said input of said amplifier means;
   a second capacitance that is switchably coupled, at a rate equal to a frequency of a first frequency signal, between said input and said output of said amplifier means, said second capacitance having a first terminal that is switchably coupled to said output of said amplifier means and a second terminal that is coupled to said input of said amplifier means;
   a third capacitance having a first terminal that is switchably coupled between said input node and the reference potential, said third capacitance having a second terminal that is switchably coupled between the reference potential and said input of said amplifier means;
   a fourth capacitance having a first terminal that is coupled to said output node and a second terminal that is coupled to said second terminal of said third capacitance;
   a fifth capacitance that is coupled between said output node and said first terminal of said first capacitance;
   wherein a gain of said switched capacitor decimator circuit is given by n tines the ratio of said first capacitance to said second capacitance, where n is a ratio of the frequency of said first frequency signal to a second, lower frequency; and
   a plurality of switching means that are responsive to a first phase of said first frequency signal for,
   coupling said first terminal of said first capacitance to the reference potential,
   coupling said first terminal of said second capacitance to said output of said amplifier means; and
   coupling said first terminal of said third capacitance to said input node while coupling said second terminal of said third capacitance to the reference potential,
   said switching means being responsive to a second phase of said first frequency signal for, coupling said first terminal of said first capacitance to said input node, uncoupling said first terminal of said second capacitance from said output of said amplifier means, and coupling said first terminal of said third capacitance to the reference potential while coupling said second terminal of said third capacitance to the input of said amplifier means;

wherein said plurality of switching means operate to compensate said switched capacitor decimator circuit such that the DC offset voltage of said amplifier means appears at said output node amplified with a gain of unity; wherein said first and second phases of said first frequency signal are applied n times during a sampling interval; and wherein said switched capacitor decimator circuit further comprises switching means coupled across said second capacitance for shorting said output of said amplifier means to said input of said amplifier means at a beginning of the sampling interval.

5. A switched capacitor decimator circuit as set forth in claim 4 wherein said second capacitance is comprised of a plurality of capacitances that are switchably connected together for controllably varying the gain of said switched capacitor decimator circuit.

* * * * *